United States Patent
Brunnbauer et al.

(10) Patent No.: US 8,106,497 B2
(45) Date of Patent: Jan. 31, 2012

(54) SEMICONDUCTOR MODULE HAVING A SEMICONDUCTOR CHIP STACK AND METHOD

(75) Inventors: Markus Brunnbauer, Lappersdorf (DE); Markus Fink, Zell (DE); Hans-Gerd Jetten, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 494 days.

(21) Appl. No.: 11/622,691

(22) Filed: Jan. 12, 2007

(65) Prior Publication Data
US 2007/0176277 A1 Aug. 2, 2007

(30) Foreign Application Priority Data
Jan. 12, 2006 (DE) .......................... 10 2006 001 792

(51) Int. Cl.
*H01L 21/02* (2006.01)
(52) U.S. Cl. ........ 257/686; 257/706; 257/712; 257/720; 257/777
(58) Field of Classification Search .................. 257/777, 257/686
See application file for complete search history.

(56) References Cited

U.S. PATENT DOCUMENTS

| | | | |
|---|---|---|---|
| 4,034,468 A * | 7/1977 | Koopman | 29/825 |
| 5,316,080 A | 5/1994 | Banks et al. | |
| 5,548,161 A * | 8/1996 | Hirano et al. | 257/722 |
| 6,407,922 B1 | 6/2002 | Eckblad et al. | |
| 6,472,741 B1 * | 10/2002 | Chen et al. | 257/712 |
| 6,716,676 B2 | 4/2004 | Chen et al. | |
| 6,831,359 B2 | 12/2004 | Heilbronner | |
| 6,891,724 B2 | 5/2005 | De Lorenzo et al. | |
| 7,196,411 B2 * | 3/2007 | Chang | 257/706 |
| 2003/0209802 A1 * | 11/2003 | Awano | 257/712 |
| 2004/0097635 A1 | 5/2004 | Fan et al. | |
| 2005/0052358 A1 * | 3/2005 | Cho et al. | 345/60 |
| 2005/0116336 A1 | 6/2005 | Chopra et al. | |
| 2006/0060963 A1 * | 3/2006 | Chang | 257/706 |
| 2006/0158857 A1 | 7/2006 | Luckner et al. | |
| 2007/0126116 A1 * | 6/2007 | Dangelo et al. | 257/720 |
| 2008/0314568 A1 * | 12/2008 | Zhan et al. | 165/135 |
| 2009/0213551 A1 * | 8/2009 | Wyland | 361/708 |

FOREIGN PATENT DOCUMENTS

| | | |
|---|---|---|
| DE | 9321423 | 1/1998 |
| DE | 10042839 | 4/2002 |
| DE | 10248644 | 5/2004 |
| DE | 10324377 | 1/2005 |

(Continued)

OTHER PUBLICATIONS

Che et al., Thermal Conductivity of Carbon Nanotubes, Foresight Nanotech Institute, 1 page, Jan. 12, 2005 1-1.

Kim et al., Thermal Transport Measurements of Individual Multiwalled Nanotubes, Physical Review Letters, vol. 87, No. 2, Nov. 19, 2001, 4 pages.

(Continued)

*Primary Examiner* — Angel Roman
(74) *Attorney, Agent, or Firm* — Dicke, Billig & Czaja, PLLC (57) ABSTRACT

A semiconductor module having a semiconductor chip stack and a method for producing the same is disclosed. In one embodiment, a thermally conductive layer with anisotropically thermally conductive particles is arranged between the semiconductor chips. The anisotropically thermally conductive particles have a lower thermal conductivity in a direction vertically with respect to the layer or the film than in a direction of the layer or the film.

17 Claims, 5 Drawing Sheets

FOREIGN PATENT DOCUMENTS

| | | |
|---|---|---|
| DE | 10345157 | 5/2005 |
| DE | 102005002812 | 8/2006 |
| WO | 2005031864 | 4/2005 |
| WO | 2005038907 | 4/2005 |
| WO | 2005041256 | 5/2005 |

OTHER PUBLICATIONS

Carnegie Mellon University, Chemists adapt casting technique to make ordered nanocarbons, PhysOrg.com, 1 page, Jan. 12, 2005.

* cited by examiner

SEMICONDUCTOR MODULE HAVING A SEMICONDUCTOR CHIP STACK AND METHOD

CROSS-REFERENCE TO RELATED APPLICATIONS

This Utility Patent Application claims priority to German Patent Application No. DE 10 2006 001 792.1 filed on Jan. 12, 2006, which is incorporated herein by reference.

BACKGROUND

The invention relates to a semiconductor module having a semiconductor chip stack.

In the case of such semiconductor chip stacks in semiconductor modules, the silicon area that can contribute to dissipating heat decreases as a result of the stacking. This fact leads to restrictions in the combination of different devices with semiconductor chip stacks. In order to dissipate the heat, cooling elements may be arranged on the top side of the semiconductor chip stack and/or on the underside of the semiconductor chip stack, but the cooling elements cannot directly dissipate the heat between the stacked semiconductor chips.

The dissipation of heat from the rear side of a semiconductor chip via a heat distributor to a heat sink is known from the document U.S. Pat. No. 6,407,922 B1. In that case, there is arranged on the rear side of the semiconductor chip a heat distributor that distributes the heat via carbon nanotubes from the rear side of the semiconductor chip over a relatively large area of the heat sink by virtue of the carbon nanotubes extending from the rear side of the semiconductor chip generating heat loss to the heat sink. This solution of heat dissipation to a heat sink from the rear side of a semiconductor chip has the disadvantage that it is not suitable for heat dissipation between the semiconductor chips even though rear sides of the semiconductor chips are available there. A heat distributor such as is known for the above document cannot be applied to the problem of dissipating heat between the individual semiconductor chips of a semiconductor chip stack.

For these and other reasons, there is a need for the present invention.

SUMMARY

One embodiment provides a and integrated including a semiconductor chip stack and a method for producing the same. In one embodiment, the semiconductor chip stack is arranged on a wiring substrate. A thermally conductive layer, in particular a film with anisotropically thermally conductive particles is arranged between the semiconductor chips. The anisotropically thermally conductive particles have a lower thermal conductivity in a direction vertically with respect to the layer or the film than in a direction of the layer or the film.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a semiconductor component, including a film or a layer which can be used to effectively dissipate the heat between the individual semiconductor chips of a semiconductor chip stack.

In one embodiment, the invention provides a semiconductor module having a semiconductor chip stack, the semiconductor chip stack being arranged on a wiring substrate and a thermally conductive layer, in particular a film having anisotropically thermally conductive particles, being arranged between the semiconductor chips. In this respect, the anisotropically thermally conductive particles have a lower thermal conductivity in a direction vertically with respect to the layer or the film than in a direction of the layer or the film.

With a semiconductor module of this type, the anisotropically thermally conductive layer or film that is arranged between the stacked semiconductor chips transports away the heat loss directly from the semiconductor chip stack in a lateral direction, especially as the stacking of the semiconductor chips means that the vertical direction is blocked anyway and can contribute next to nothing to the heat dissipation.

In one embodiment of the invention, the thermally conductive particles have, in a lateral direction of the layer or in a direction of the film, a thermal conductivity that is at least one order of magnitude greater than in a vertical direction with respect to the layer or with respect to the film. This specific orientation of the thermally conductive particles enables the heat present between two semiconductor chips in a semiconductor chip stack to be dissipated laterally or horizontally from the semiconductor chip.

In a further embodiment of the invention, the anisotropically thermally conductive layer or film has multiwalled carbon nanotubes whose longitudinal extent is adapted to the layer.

Such carbon nanotubes have the advantage of a low density, which with a value of 1.33 to 1.4 g/cm$^2$ is a factor of 2 lower than the density of aluminum. The tensile strength of the carbon nanotubes, with a value of approximately $10^{11}$ Pa, is also several orders of magnitude better than in the case of conventional films, so that films having particles composed of carbon nanotubes can bridge greater distances in a cavity housing and the risk of this thermally conductive layer composed of carbon nanotubes tearing away under high thermal loading on account of different coefficients of expansion of the materials involved in a semiconductor module or on a superordinate circuit board is lower in comparison with conventional heat conducting layers.

Since carbon nanotubes do not have any grain boundaries over a length of 10 nanometers up to a few millimeters, their deformability and elasticity are significantly greater than in the case of conventional materials and rupturing or microcracking at grain boundaries is practically impossible. Finally, it is of particular importance for the dissipation of the heat loss from semiconductor chip stacks that the thermal conduction of such carbon nanotubes, with a value of 6000 W/m and K (watts per meter and degree kelvin), is virtually twice as high as in the case of diamond. Moreover, the properties can be improved further, particularly in terms of the current loading and the breaking strength by means of the multiwalled nature of the carbon nanotubes.

The diameter of such multiwalled carbon nanotubes lies between 10 and 300 nanometers, the thermal conduction preferably being effected in the longitudinal direction of the carbon nanotubes and being greater by several orders of magnitude then perpendicular to the longitudinal direction of the carbon nanotubes. For this purpose, carbon nanotubes have cylindrical walls nested in one another, each cylindrical wall being constructed from sixfold carbon rings strung together.

In a further embodiment, the thermally conductive particles in the form of carbon nanotubes are arranged crosswise and transversely and not perpendicularly to the layer or the film. This results in an anisotropy which are equivalent in the area of the layer as in the system of Cartesian coordinates in the directions X and Y, while they have, perpendicular thereto in the Z direction, a thermal conductivity that is lower by several orders of magnitude.

It is furthermore provided that the anisotropically thermally conductive particles are oriented in a common direction within the layer or within the film. In this case, the thermal conduction is predominantly effected in this main direction, so that a high degree of anisotropy already prevails within the layer or the film, which anisotropy can, however, be utilized in a manner for semiconductor chip stacks by means of corresponding patterning measures.

In one embodiment, the anisotropically thermally conductive layer or the film extends in the semiconductor module from one edge side as far as an opposite edge side of the semiconductor module and is freely accessible on the edge sides of the semiconductor module, so that the dissipated heat can be emitted directly to the surroundings.

In one embodiment, the lower semiconductor chip is electrically connected to the wiring substrate via flip-chip contacts. For this purpose, there may be arranged between the wiring substrate and the lower semiconductor chip an underfill composition that envelopes the flip-chip contacts, in order to compensate for the differences in the coefficient of thermal expansion of the semiconductor chip and of the wiring substrate.

In one embodiment, the semiconductor module has at least one stacked semiconductor chip which is electrically connected to the wiring substrate via bonding connections. Since the anisotropically conductive layer or film passes transversely through the semiconductor chip stack or is arranged between the lower and upper semiconductor chips, the bonding connections are led through the anisotropically thermally conductive layer or film, for which purpose the film or the layer preferably has correspondingly large openings. Therefore, the bonding connections are arranged on two opposite edge sides of the stacked semiconductor chip, so that on two edge sides, the film or the layer in each case has an elongated opening in order to lead through the bonding connections. This has the advantage that an anisotropically thermally conductive layer or film can run continuously through the remaining edge regions.

It is furthermore provided that the rear side of a stacked semiconductor chip has a thermally and electrically conductive metal layer, preferably a copper layer or an aluminum layer or a layer made of an alloy thereof. A metal layer of this type is already provided by reasons of electrical functionality for most semiconductor chips and, for improving the thermal conduction, may have a higher thickness than normal in order to reduce the thermal resistance with respect to the anisotropically thermally conductive layer or anisotropically thermally conductive film.

In a further embodiment, the lower and the upper semiconductor chips are surrounded by lower and/or upper heat conducting rings adapted to the thickness of the semiconductor chips. The heat conducting rings are composed of a thermally conductive metal. The lower heat conducting ring carries the anisotropically thermally conductive layer or film and accordingly has a height corresponding to the thickness of the lower semiconductor chip. The lower heat conducting ring is arranged on the wiring substrate while leaving free contact pads for the bonding connection to the stacked semiconductor chip and together with the wiring substrate forms the lower region of the semiconductor module. The lower region of the semiconductor module is covered by the thermally conductive film or layer, so that a lower cavity forms as a result of the distance between the heat conducting rings and the lower semiconductor chip.

An upper heat conducting ring is then arranged on the thermally conductive layer or thermally conductive film that closes off the lower region, the height of the upper heat conducting ring being adapted to the thickness of the upper semiconductor chip and, if necessary, to the size of the arcs with which the bonding connections project over the upper semiconductor chip. Moreover, in one embodiment of the invention, the upper heat conducting ring may merge into an upper covering, so that the upper heat conducting ring surrounds the hollow housing with the enclosed chip stack.

It is furthermore possible to provide cooling fins on the covering in order to dissipate the heat via the anisotropically thermally conductive layer or film and the heat conducting rings and also the cooling fins on the covering of the upper heat conducting ring. The heat conducting rings have an angular contour adapted to the angular shape of the semiconductor chips. Moreover, the heat conducting rings may include heat conducting blocks which surround the semiconductor chip stack.

A further embodiment relates to a film for the heat dissipation of a semiconductor chip stack, which is arranged between and/or above and/or below the semiconductor chip stack and has anisotropically thermally conductive particles, the anisotropically thermally conductive particles having a lower thermal conductivity in a direction vertically with respect to the film than in a lateral direction of the film. A film of this type has the advantage that it can be employed diversely in semiconductor technology and is used wherever it is important to dissipate heat in a predetermined direction. For this purpose, the thermally conductive film has thermally conductive particles in a lateral direction of the film which have a greater thermal conduction in a lateral direction than in a vertical direction with respect to the film. In this case, the thermal conductivities differ by at least one order of magnitude between the horizontal direction and the vertical direction.

In one embodiment, multiwalled carbon nanotubes are arranged in the anisotropically thermally conductive film, the longitudinal extent of the carbon nanotubes being adapted to the anisotropically thermally conductive layer. The thermal conduction of the carbon nanotubes in the longitudinal direction, with a value of 6000 W/m and K is virtually twice as high as in the case of a diamond, which, as is known, has the hitherto highest thermal conductivity of solids.

The order of magnitude of such carbon nanotubes in terms of a diameter d in nanometers of between $10\ nm \leq d \leq 300\ nm$ and a length of the order of magnitude of a few tens of nanometers to a few millimeters permits a diverse application of the anisotropically thermally conductive particles. This includes the possibility of orienting the particles in the anisotropically thermally conductive film in a single lateral direction.

A method for producing a semiconductor module having semiconductor chip stacks has the following processes. The first process involves producing a wiring substrate with contact pads for flip-chip contacts of a lower semiconductor chip in the center of the wiring substrate and contact pads for at least one semiconductor chip to be stacked in edge regions of the wiring substrate. A lower semiconductor chip with flip-chip contacts is subsequently applied in the center of the wiring substrate. This is followed by application of lower heat conducting blocks or a heat conducting ring having the height corresponding to the thickness of the lower semiconductor chip. This is followed by application of a film with an anisotropically thermally conductive layer to the lower semiconductor chips and the lower heat conducting blocks or the heat conducting ring.

Afterward, on this structure, it is possible to align a semiconductor chip directly on the film or the thermally conductive layer over the lower semiconductor chip. The film has at least one opening through which it is possible to apply bonding connections between the stacked semiconductor chip and the contact pads in edge regions of the wiring substrate. The application of bonding connections of this type is followed by the application of upper heat conducting blocks or an upper heat conducting ring in edge regions of the film, aligned with the lower heat conducting blocks or the lower heat conducting ring.

The semiconductor chip stack is closed off by application of a thermally conducting covering to the upper heat conducting block or the heat conducting ring, with the result that a cavity housing has been produced whose cavity has been divided into individual smaller cavities by the anisotropically thermally conductive layer or the film. This method has the advantage that as many semiconductor chips as desired with anisotropically thermally conductive layers or films arranged in between can be stacked one on top of another. This results in a semiconductor module whose heat loss can be optimally cooled toward the outside by means of the anisotropically thermally conductive films and the heat conducting blocks or heat conducting rings.

Metal rings surrounding the semiconductor chips in the edge regions of the wiring substrate or the film are applied as lower and/or upper heat conducting blocks. For this purpose, the film has an anisotropically thermally conductive layer in the core region and is covered by thermally conductive adhesive layers on both sides.

An alternative method for producing a plurality of semiconductor modules having semiconductor chip stacks has the following method processes. The first process involves producing a wiring substrate with semiconductor module positions arranged in rows and columns. The semiconductor substrate is then populated with lower semiconductor chips in the semiconductor module positions. An anisotropically thermally conductive layer is then applied to the lower semiconductor chips. Afterward, it is already possible for the stacking to begin and, finally, it is possible to apply bonding connections between the stacked semiconductor chip and the wiring substrate.

The edge sides of the lower semiconductor chip are subsequently embedded into a lower plastic housing composition with partial encapsulation of the bonding connections for all the semiconductor module positions. An anisotropically thermally conductive layer is then likewise applied to the embedded edge sides composed of a plastic housing composition, with the result that a continuously thermally conductive layer is now arranged on the wiring substrate or on the lower plastic housing composition. Afterward, it is then possible to apply an upper plastic housing composition to the anisotropically thermally conductive layer with embedding of the stacked semiconductor chip and the remainder of the bonding connections into the upper plastic housing composition to form a composite board. Finally, the composite board can be separated into individual semiconductor modules.

With this method, a plurality of semiconductor modules can be produced simultaneously in parallel manufacturing processes, the difficulty of applying the anisotropically thermally conductive layer in two stages being surmounted. In this case, a first stage includes the application of the anisotropically thermally conductive layer between two stacked semiconductor chips and subsequently the application of the anisotropically thermally conductive layer on the lower plastic housing composition. In one exemplary embodiment of the method, the interspaces between the lower semiconductor chip and the wiring substrate are filled with an underfill material and the flip-chip contacts of the lower semiconductor chip are simultaneously embedded into the underfill material in the process.

To summarize, it can be stated that the anisotropically thermally conductive layer or film alters the heat flow in the semiconductor chip stack in such a way that heat dissipation can take place via the outer edges of the semiconductor chip stack or of the semiconductor module. The anisotropically thermally conductive layer and the film are applied by means of a "film casting" for carbon nanotubes on the semiconductor chip interface from which heat is to be dissipated. On account of the thermal conductivity that is greater by up to three powers of ten along the longitudinal axis of the carbon nanotubes, the heat is dissipated laterally.

Figure 1:
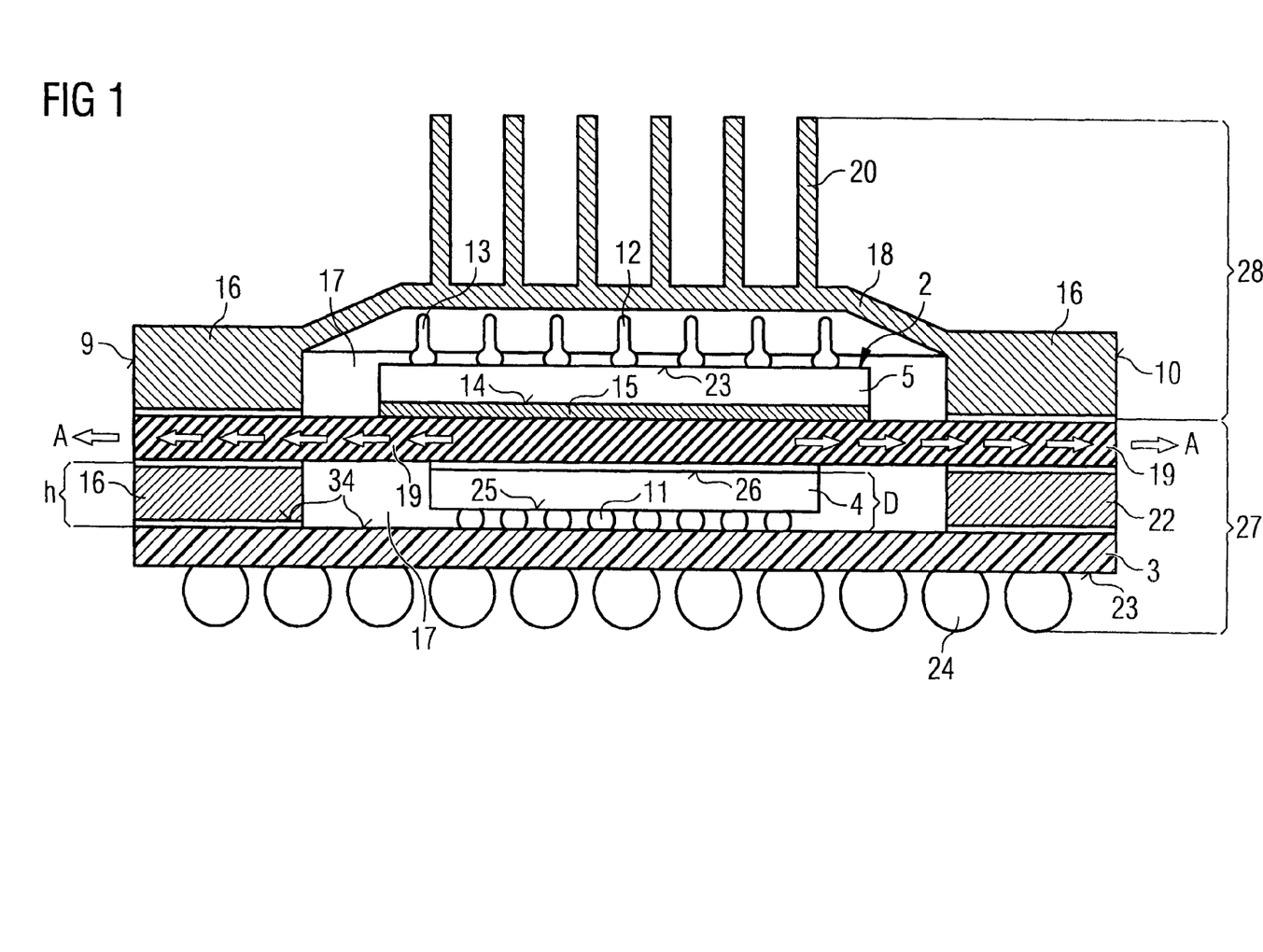
FIG. 1 illustrates a schematic cross section through a semiconductor module in accordance with one embodiment of the invention.

FIG. 1 illustrates a schematic cross section through a semiconductor module 1 in accordance with one embodiment of the invention. The semiconductor module 1 is constructed on a wiring substrate 3 having external contacts 24 on its underside 23. On the top side 34 of the wiring substrate 3, a semiconductor chip stack 2 having a lower semiconductor chip 4 and a semiconductor chip 5 is arranged in the centre. The semiconductor chip stack 2 is surrounded by a cavity housing having three components in this embodiment of the invention. Firstly, a heat conducting ring 16 composed of a metal is arranged in the edge region of the top side 34 of the wiring substrate 3.

The heat conducting ring 16, as a metal ring 22, surrounds the lower semiconductor chip 4 and has a height h corresponding to the thickness D of the lower semiconductor chip 4 with the flip-chip contacts 11. With the flip-chip contacts 11, the lower semiconductor chip 4 is fixed in the centre on the wiring substrate 3. The flip-chip contacts 11 on the active top side 25 of the lower semiconductor chip 4 are connected to the external contacts 24 of the semiconductor module via a wiring structure composed of conductor tracks and through contacts (not illustrated). Arranged on the rear side 26 of the lower semiconductor chip 4 is an anisotropically thermally conductive film 19, which also extends over the heat conducting ring 16, so that the heat loss generated in the lower semiconductor chip 4 is laterally transported via the anisotropically thermally conductive film 19 as far as the edge sides 9 and 10 of the semiconductor module, where it can be radiated to the surroundings in arrow direction A.

A lower region 27 of the semiconductor module 1 is practically closed off by the anisotropically thermally conductive film 19, a cavity 17 being formed in the lower region 27. An upper semiconductor chip 5 is stacked in the center of the semiconductor module 1 on the anisotropically thermally conductive film 19, the upper semiconductor chip having a metal layer 15 on its rear side 14, which metal layer is intended to support the heat dissipation to the anisotropically thermally conductive film 19. Bonding connections 12 are arranged on the active top side 29 of the upper semiconductor chip 5, the bonding connections having bonding wires 13 and producing a connection between the upper semiconductor chip 5 and the wiring substrate 3.

In the edge regions of the semiconductor module 1, a heat conducting ring 16 is arranged in the upper region 28 of the semiconductor module 1, the heat conducting ring merging integrally into a covering 18, which, for its part, bears cooling fins 20 in order to achieve effective heat dissipation to the surroundings. In this case, a cavity 17 is formed by the heat conducting ring 16 and the covering 18, the cavity, in the upper region 28 of the semiconductor module 1, being adapted to the stacked semiconductor chip 5 with its bonding connections 13.

One advantage of this semiconductor component is that the anisotropically thermally conductive film has a thermal conductivity that is higher by at least one order of magnitude in arrow direction A than vertically with respect thereto.

Figure 2:
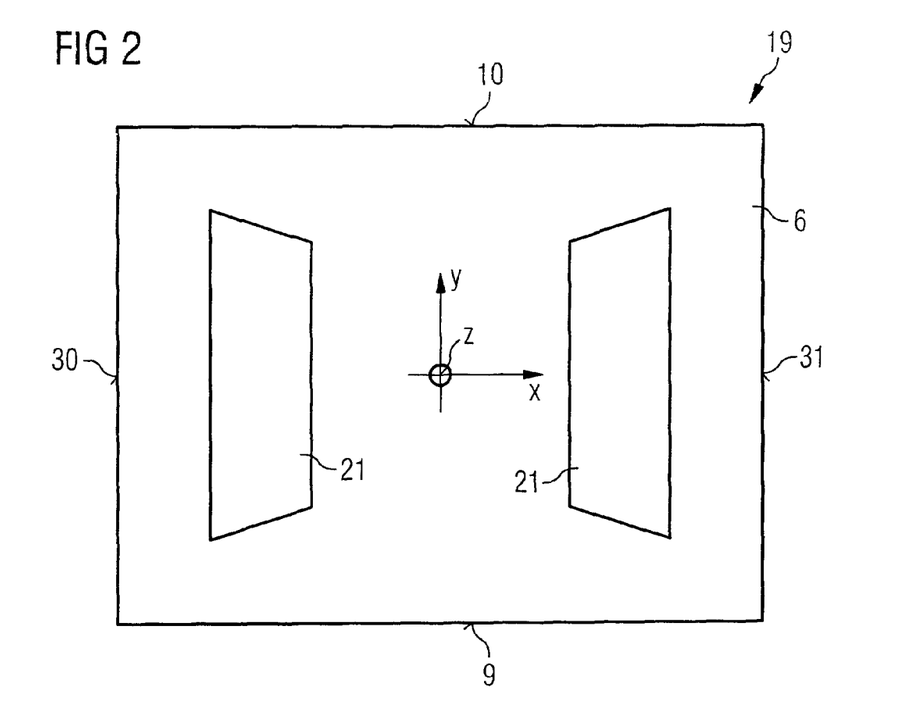
FIG. 2 illustrates a schematic plan view of an anisotropically thermally conductive film for a semiconductor module in accordance with FIG. 1.

FIG. 2 illustrates a schematic plan view of an anisotropically thermally conductive film 19 for the semiconductor module 1 in accordance with FIG. 1. The anisotropically thermally conductive film 19 has, with its edge sides 9, 10, 30 and 31 a contour adapted to the external contour of the semiconductor module, so that the edge sides 9, 10, 30 and 31 of the anisotropically thermally conductive film 19 can exchange heat with the surroundings. Furthermore, the film 19 has two openings 21 through which bonding wires or bonding connections can be led.

The anisotropy of the thermal conduction is caused by anisotropically thermally conductive particles which are included in the film 19 or from which the film is constructed. These may extend laterally crosswise and transversely in the film 19, so that no anisotropy can be established in the X and Y directions and an anisotropy of the thermal conductivity becomes effective only with respect to the Z direction. On the other hand, it is also possible to orient the particles in one direction, preferably in the Y direction, so that the highest possible heat dissipation is effected in the Y direction.

Figure 3:
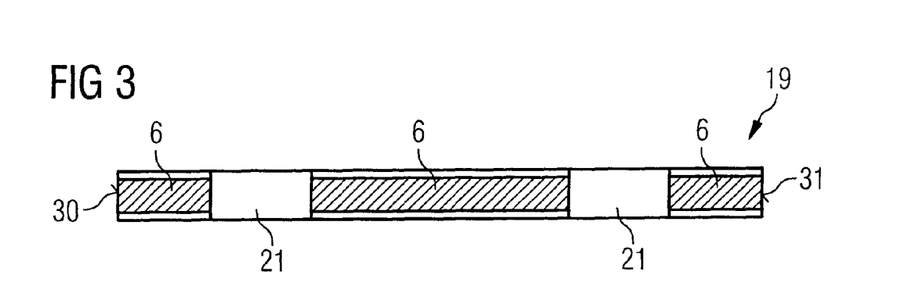
FIG. 3 illustrates a schematic cross section through the anisotropically thermally conductive film in accordance with FIG. 2.

FIG. 3 illustrates a schematic cross section through the anisotropically thermally conductive film 19. The cross section additionally illustrates that the film has an anisotropically thermally conductive layer 6 as core layer, which is covered by adhesive layers on its top side and underside. The adhesive layers are likewise thermally conductive in order to establish a good contact with the stacked semiconductor chips and also with the stack of heat conducting rings.

Figure 4:
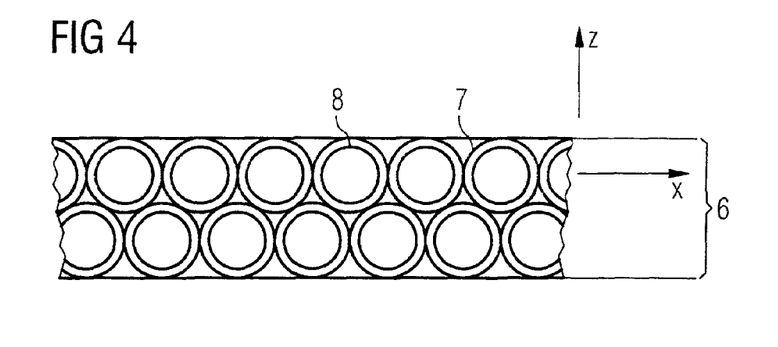
FIG. 4 illustrates a schematic cross section through carbon nanotubes in an anisotropically thermally conductive layer.

FIG. 4 illustrates a schematic cross section through carbon nanotubes 8 in an anisotropically thermally conductive layer 6 with anisotropically thermally conductive particles 7. The carbon nanotubes 8 are stacked one on top of another in the longitudinal direction and have, in the longitudinal direction, a thermal conductivity that is higher by three powers of ten and transversely with respect to the direction. Moreover, the carbon nanotubes 8 have a multiwalled nature having hundreds of atomic layers nested cylindrically in one another. In this case, the diameter d of the multiwalled carbon nanotubes is between 10 nm ≦ d ≦ 300 nm.

Figure 5:
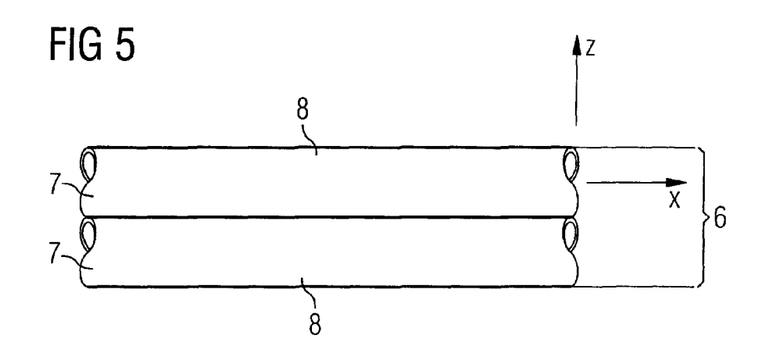
FIG. 5 illustrates a schematic side view of the carbon nanotubes in accordance with FIG. 4.

FIG. 5 illustrates a schematic side view of the carbon nanotubes 8 in accordance with FIG. 4 and illustrates that, in this embodiment of the invention, carbon nanotubes are densely packed in the anisotropically thermally conductive film and are oriented in one direction. In this longitudinal extent, their thermal conductivity is 6000 W/m and K, which corresponds virtually to twice the thermal conductivity of diamond.

Figure 6:
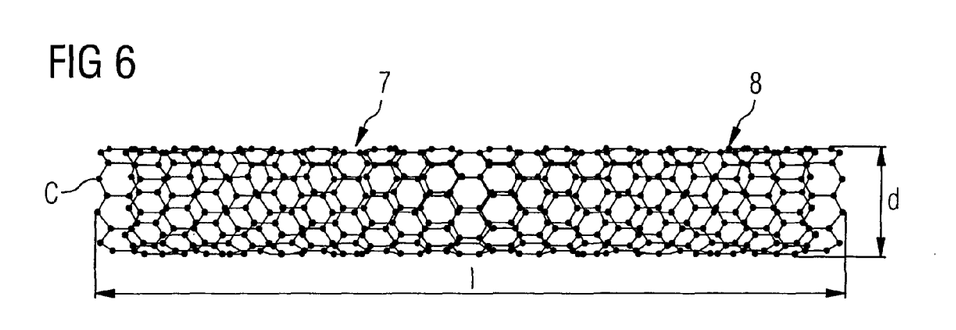
FIG. 6 illustrates a basic schematic diagram of a carbon nanotube.

FIG. 6 illustrates a basic schematic diagram of a carbon nanotube, and in particular the atomic structure of such carbon nanotubes. The length 1 may be several 10s of nanometers to several millimeters. The diameter d, as already mentioned above, is likewise variable. This structural representation of the carbon nanotube illustrates a single-walled carbon nanotube, which usually has a diameter d of approximately 0.3 nm. However, as already mentioned above, a multiplicity of carbon nanotubes may be nested in one another or above one another in cylindrical form. The carbon atoms C on the lateral surface of the carbon nanotube are arranged in a sixfold ring structure. Since the carbon nanotubes do not form crystal boundaries, they are extremely elastic and resistant to breaking.

Figure 7:
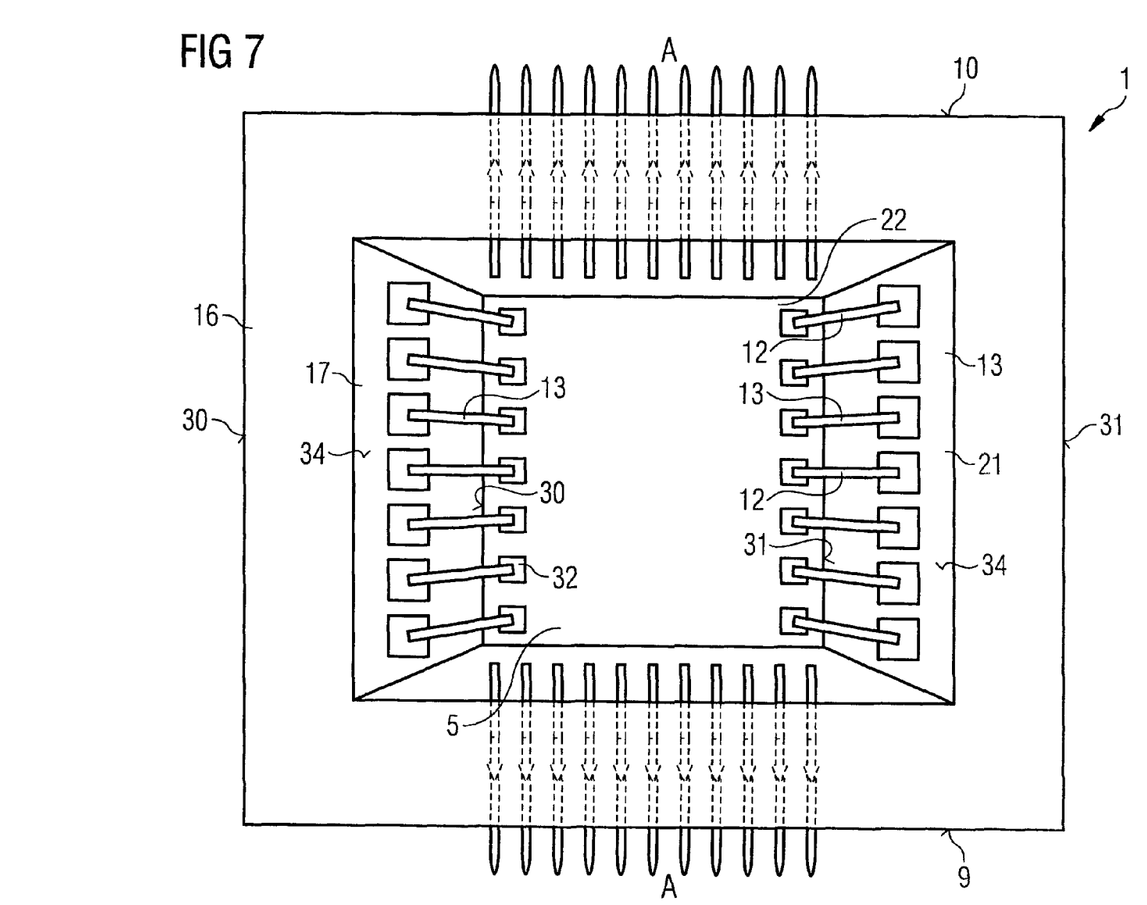
FIG. 7 illustrates a schematic plan view of the semiconductor module in accordance with FIG. 1.

FIG. 7 illustrates a schematic plan view of the semiconductor module 1 in accordance with FIG. 1. The covering has been omitted, however, so that the upper heat conducting ring 16 is visible. Arranged under the latter is the anisotropically thermally conductive film 19 with the upper semiconductor chip 5 fixed thereon. The semiconductor chip 5 has contact areas 32 in edge regions of two edge sides 30 and 31, on which bonding wires 13 are bonded, which bonding wires are led through the openings 21 in the anisotropically thermally conductive film 19 to contact pads 33 on the top side 34 of the wiring substrate 3. In order to achieve a greatest possible heat dissipation by the carbon nanotubes, the latter are oriented in arrow direction A, so that the majority of the heat can be dissipated in this direction on the outer sides 9 and 10 of the semiconductor module 1.

Figure 8:
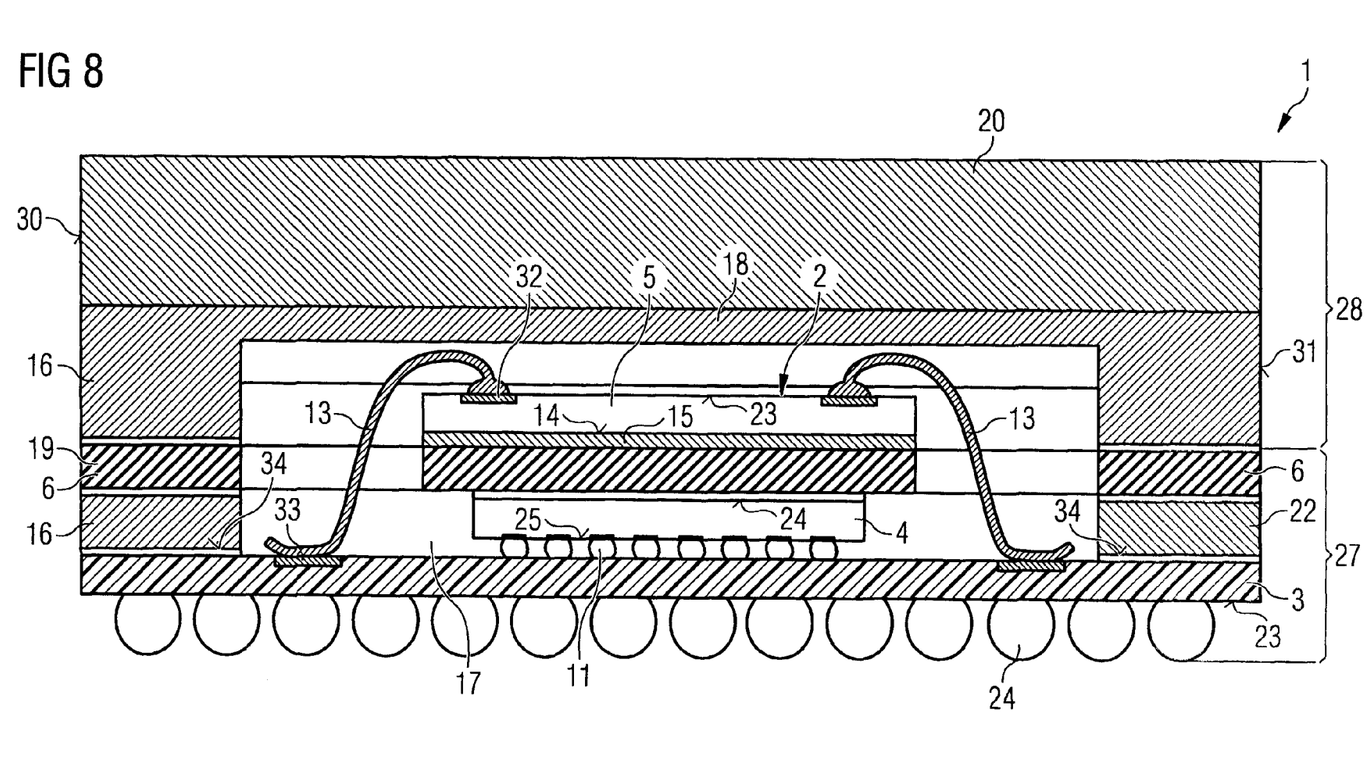
FIG. 8 illustrates a schematic cross section through the semiconductor module in accordance with FIG. 1.

FIG. 8 illustrates a schematic cross section through the semiconductor module 1 in accordance with FIG. 1. Components having functions identical to those in the previous Figures are identified by the same reference symbols and are not explained separately. This cross section extends from the edge side 30 to the edge side 31 and illustrates the cavity 17 of the cavity housing in the region in which bonding wires 13 are arranged. The bonding wires 13 form bonding connections 12 between contact areas 32 of the stacked and upper semiconductor chip 5 with contact areas 33 of the wiring structure of the wiring substrate 3. In this case, the bonding wires 13 are led through the openings 21 in the anisotropically thermally conductive film 19 with a thermally conductive layer 6 as core layer.

Via the wiring structure of the wiring substrate 3, the contact pads 33 are connected to corresponding contact pads for the flip-chip contacts 11 of the lower semiconductor chip 4 via conductor tracks (not illustrated) and are connected via through contacts (not illustrated) to the external contacts 24 of the semiconductor module 1 on the underside 23 of the wiring substrate 3. In this embodiment of the invention, an upper heat conducting ring 16 merges into a cover 18, which in turn has cooling fins 20, the heat conducting ring 16, the covering 18 and the cooling fins 20 having been cast integrally by means of one production process in order to simplify mounting and storage.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A stacked semiconductor module comprising:
    a first semiconductor chip with an active side mounted to a wiring substrate and having a rear side;
    second semiconductor chip stacked above the first semiconductor chip and having an active side and a read side facing the rear side of the first semiconductor chip;
    a thermally conductive layer arranged between the rear sides of the first and second semiconductor chips, the thermally conductive layer including anisotropically thermally conductive particles having a lower thermal conductivity in directions orthogonal to the layer than in lateral directions of the layer;
    a first heat ring disposed about a perimeter of the first semiconductor chip and positioned between the wiring substrate and the thermally conductive layer;
    a second heat ring disposed about a perimeter of the second semiconductor chip and positioned on the thermally conductive layer; and
    a heat conductive lid including cooling fins disposed above the second semiconductor chip and which mergers into the second heat ring.

2. The stacked semiconductor module of claim 1, wherein the thermally conductive layer comprises a film.

3. The stacked semiconductor module of claim 1, wherein the thermally conductive particles have, in a lateral direction of the layer, a thermal conductivity that is at least one order of magnitude greater than in a direction orthogonal to the layer.

4. The stacked semiconductor module of claim 1, wherein the anisotropically thermally conductive layer comprises multiwalled carbon nanotubes whose longitudinal extent is aligned with a selected lateral direction of the layer.

5. The stacked semiconductor module of claim 4, comprising wherein the carbon nanotubes comprise a diameter d of the order of magnitude of nanometers in a range between 10 nm $\leq$ d $\leq$ 300 nm.

6. The stacked semiconductor module of claim 1, wherein the anisotropically thermally conductive particles are arranged crosswise and transversely with the layer and not orthogonally to the layer.

7. The stacked semiconductor module of claim 1, wherein the anisotropically thermally conductive particles are oriented in a common lateral direction in the layer.

8. The stacked semiconductor module of claim 1, wherein the anisotropically thermally conductive layer extends in the semiconductor module from one edge side as far as an opposite edge side of the semiconductor module and is freely accessible on the edge sides of the semiconductor module.

9. The stacked semiconductor module of claim 1, wherein the first semiconductor chip is electrically connected to the wiring substrate via flip-chip contacts.

10. The stacked semiconductor module of claim 1, wherein at least one of the first and second stacked semiconductor chips is electrically connected to the wiring substrate via bonding connections.

11. The stacked semiconductor module of claim 1, wherein bonding wires pass through an opening in the anisotropically thermally conductive layer.

12. The stacked semiconductor module of claim 1, wherein the rear side of a stacked semiconductor chip comprises a thermally and electrically conductive metal layer, comprising a copper layer or an aluminum layer or a layer made of an alloy thereof.

13. The stacked semiconductor module of claim 1, wherein the first and the second heat conducting rings are adapted to the thickness of the first and second semiconductor chips.

14. The stacked semiconductor module of claim 13, wherein the first and second heat conducting rings are composed of heat conducting blocks and form a cavity in which the semiconductor chip stack is arranged, and the cavity being closed off by a covering.

15. The stacked semiconductor module of claim 13, wherein the heat conducting rings are thermally connected via a film with an anisotropically thermally conductive layer.

16. The stacked semiconductor module of claim 1, wherein the anisotropically thermally conductive layer comprises multiwalled carbon nanotubes whose longitudinal extent is aligned with a selected lateral direction of the layer and extends from one edge side of the semiconductor module to an opposite edge side and is freely accessible on the opposing edge sides, and wherein the carbon nanotubes are disposed substantially in parallel with one another across the layer substantially perpendicular to the selected lateral direction, the carbon nanotubes dissipating heat from the opposing edge sides.

17. The stacked semiconductor module of claim 1, wherein the anisotropically thermally conductive layer comprises multiwalled carbon nanotubes whose longitudinal extent is aligned with a selected lateral direction of the layer, wherein the lower semiconductor chip is electrically connected to the wiring substrate via flip-chip contacts, and wherein at least one semiconductor chip stacked above the lower semiconductor chip is electrically connected to the wiring substrate via bonding connections which pass through corresponding openings in the anisotropically thermally conductive layer.

* * * * *